US010731914B2

(12) United States Patent
Morie

(10) Patent No.: US 10,731,914 B2
(45) Date of Patent: Aug. 4, 2020

(54) CRYOCOOLER AND MAGNETIC SHIELD STRUCTURE OF CRYOCOOLER

(71) Applicant: SUMITOMO HEAVY INDUSTRIES, LTD., Tokyo (JP)

(72) Inventor: Takaaki Morie, Yokosuka (JP)

(73) Assignee: SUMITOMO HEAVY INDUSTRIES, LTD., Tokyo (JP)

( * ) Notice: Subject to any disclaimer, the term of this patent is extended or adjusted under 35 U.S.C. 154(b) by 94 days.

(21) Appl. No.: 16/028,435

(22) Filed: Jul. 6, 2018

(65) Prior Publication Data

US 2019/0011170 A1 Jan. 10, 2019

(30) Foreign Application Priority Data

Jul. 7, 2017 (JP) ................. 2017-134040

(51) Int. Cl.
| | |
|---|---|
| F25D 19/00 | (2006.01) |
| F25B 9/10 | (2006.01) |
| G01R 33/38 | (2006.01) |
| G01R 33/3815 | (2006.01) |
| F25B 9/00 | (2006.01) |
| F25B 9/14 | (2006.01) |

(Continued)

(52) U.S. Cl.
CPC ............ *F25D 19/006* (2013.01); *F25B 9/002* (2013.01); *F25B 9/10* (2013.01); *G01R 33/3804* (2013.01); *G01R 33/3806* (2013.01); *G01R 33/3815* (2013.01); *F25B 9/145* (2013.01); *F25B 2309/001* (2013.01); *F25B 2309/1406* (2013.01); *F25B 2309/1428* (2013.01); *F25B 2500/11* (2013.01); *F25B 2500/12* (2013.01); *G01R 33/421* (2013.01); *H01F 6/04* (2013.01)

(58) Field of Classification Search
CPC .... F25B 9/10; F25B 9/14; F25B 9/145; F25D 19/006
See application file for complete search history.

(56) References Cited

U.S. PATENT DOCUMENTS

| | | | | |
|---|---|---|---|---|
| 5,782,095 | A * | 7/1998 | Chen .................. | G01R 33/3815 62/47.1 |
| 7,714,574 | B2 | 5/2010 | Ando et al. | |
| 8,072,219 | B2 | 12/2011 | Saito et al. | |

(Continued)

FOREIGN PATENT DOCUMENTS

| | | |
|---|---|---|
| JP | H06-185819 A | 7/1994 |
| JP | 2001-263844 A | 9/2001 |

(Continued)

*Primary Examiner* — Brian M King
(74) *Attorney, Agent, or Firm* — HEA Law PLLC

(57) ABSTRACT

A cryocooler includes: a magnetic shield axially extending along a second-stage cylinder from a second-stage cooling stage outside the second-stage cylinder and disposed separated from a first-stage cooling stage by an axial separation distance, wherein an annular space open to a helium atmosphere is formed between the second-stage cylinder and the magnetic shield, and the axial depth of the annular space is longer than the axial separation distance; and a convection suppression member, for suppressing axial convection of helium gas in the annular space caused by temperature difference between the second-stage cylinder and the magnetic shield, is disposed in the annular space and is of longer axial length than the axial separation distance.

9 Claims, 9 Drawing Sheets

(51) Int. Cl.
*G01R 33/421* (2006.01)
*H01F 6/04* (2006.01)

(56) References Cited

U.S. PATENT DOCUMENTS

2006/0207265 A1* 9/2006 Sorsby ................. F25D 19/006
 62/47.1
2007/0130961 A1* 6/2007 Xu ........................... F25B 9/14
 62/6

FOREIGN PATENT DOCUMENTS

| JP | 2008-130744 A | 6/2008 |
| JP | 2008-267635 A | 11/2008 |
| JP | 2009-293909 A | 12/2009 |
| JP | 04472715 B2 | 6/2010 |

* cited by examiner

CRYOCOOLER AND MAGNETIC SHIELD STRUCTURE OF CRYOCOOLER

INCORPORATION BY REFERENCE

The entire content of Japanese Patent Application No. 2017-134040, on the basis of which priority benefits are claimed in an accompanying application data sheet, is incorporated herein by reference.

BACKGROUND

Technical Field

Certain embodiments of the present invention relate to a cryocooler and a magnetic shield structure of a cryocooler.

Description of Related Art

Cryocoolers, representative of which are Gifford-McMahon (GM) cryocoolers, are for example used to cool a superconducting magnetic system such as a magnetic resonance imaging (MRI) device. The cryocooler is provided in a superconducting magnetic system for recondensing liquid helium to cool a superconducting magnet.

SUMMARY

The present invention in one aspect affords a cryocooler including: a first-stage cooling stage for being cooled to a first-stage temperature higher than helium's liquefaction temperature; a second-stage cooling stage for being cooled to a second-stage temperature less than or equal to helium's liquefaction temperature, and including a helium condensation surface disposed in a helium atmosphere; a cylinder extending in an axial direction so as to connect the second-stage cooling stage to the first-stage cooling stage; a displacer including a magnetic regenerator material and enabled to be reciprocated in the cylinder along the axial direction; a tubular magnetic shield axially extending along the cylinder from the second-stage cooling stage, outside the cylinder, and being disposed separated from the first-stage cooling stage by an axial separation distance, in which an annular space open to the helium atmosphere is formed between the cylinder and the tubular magnetic shield, and the annular space depth-wise axially is longer than the axial separation distance; and a convection suppression member for controlling to a minimum axial convection of helium gas in the annular space caused by temperature difference between the cylinder and the tubular magnetic shield, disposed in the annular space and being of axial extent than the axial separation distance.

In another aspect, the present invention affords a cryocooler including: a first-stage cooling stage for being cooled to a first-stage temperature higher than helium's liquefaction temperature; a second-stage cooling stage for being cooled to a second-stage temperature less than or equal to helium's liquefaction temperature, and including a helium condensation surface disposed in a helium atmosphere; a cylinder extending in an axial direction so as to connect the second-stage cooling stage to the first-stage cooling stage; a displacer including a magnetic regenerator material and enabled to be reciprocated in the cylinder along the axial direction; a tubular magnetic shield axially extending along the cylinder from the second-stage cooling stage, outside the cylinder, and being disposed separated from the first-stage cooling stage by an axial separation distance, in which an annular space open to the helium atmosphere is formed between the cylinder and the tubular magnetic shield, and the annular space depth-wise axially is longer than the axial separation distance; and a liquid helium outflow hole formed in either the tubular magnetic shield or the second-stage cooling stage such that liquid helium flows from the annular space exteriorly of the tubular magnetic shield.

In still another aspect, the present invention affords a magnetic shield structure of a cryocooler, the cryocooler including a first-stage cooling stage for being cooled to a first-stage temperature higher than helium's liquefaction temperature, a second-stage cooling stage for being cooled to a second-stage temperature less than or equal to helium's liquefaction temperature, and including a helium condensation surface disposed in a helium atmosphere, and a cylinder extending in an axial direction so as to connect the second-stage cooling stage to the first-stage cooling stage, in which the magnetic shield structure includes: a tubular magnetic shield axially extending along the cylinder from the second-stage cooling stage, outside the cylinder, and being disposed separated from the first-stage cooling stage by an axial separation distance, in which an annular space open to the helium atmosphere is formed between the cylinder and the tubular magnetic shield, and the annular space depth-wise axially is longer than the axial separation distance; and a liquid helium outflow hole formed in either the tubular magnetic shield or the second-stage cooling stage such that liquid helium flows from the annular space exteriorly of the tubular magnetic shield.

DETAILED DESCRIPTION

Figure 1:
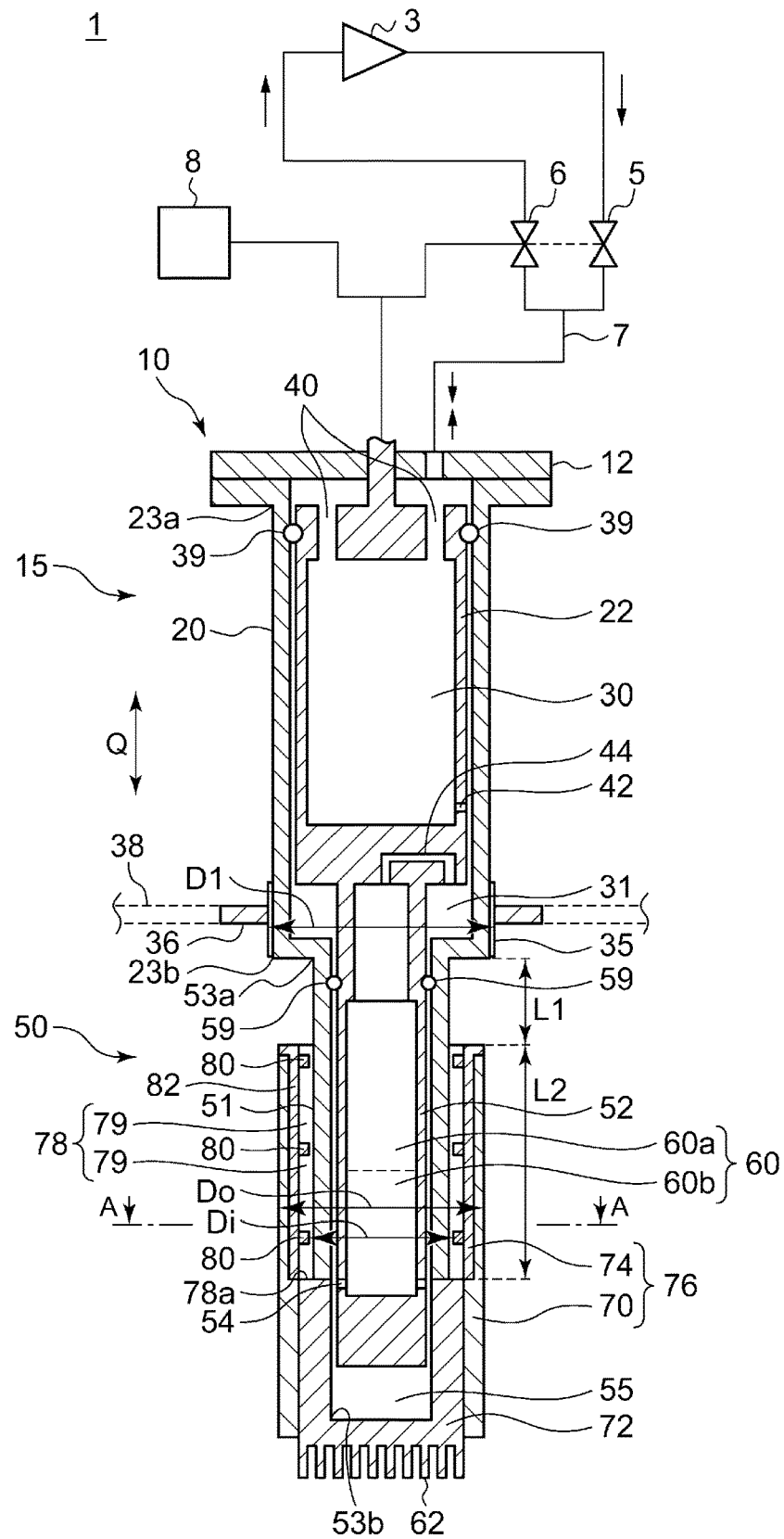
FIG. 1 is a view schematically showing a cryocooler according to a first embodiment.

In general, a magnetic regenerator material is used in cryocoolers that realize cooling to a liquid helium temperature of approximately 4.2K or less. The magnetic regenerator material can be magnetized under a relatively strong magnetic field generated by a magnetic field generating source such as a superconducting magnet. If the magnetic regenerator material moves under a magnetic field environment, magnetic noise may occur. For example, in the case of a GM cryocooler, the magnetic regenerator material is accommodated in a displacer. The magnetic regenerator material moves according to reciprocation of the displacer, and magnetic noise occurs around the GM cryocooler. The magnetic noise may change the magnetic field around the cryocooler and affect the measurement accuracy of an MRI device or other measuring device. By providing a magnetic shield in the cryocooler, influence on the surrounding environment by magnetic noise can be reduced. The magnetic shield for example is cooled to an extremely low temperature of 10K or less—e.g., a liquid-helium temperature.

In a helium recondensation cryocooler, the magnetic shield and the area of the cryocooler near the magnetic shield may be disposed such as to be exposed to a helium atmosphere. A temperature difference generated between the magnetic shield and a portion of the cryocooler causes convection of the helium gas, and heat transfer accompanying the convection may decrease the refrigeration performance of the cryocooler.

It is desirable to control degradation in refrigeration performance to a minimum in a magnetic-shield fitted cryocooler used under a helium atmosphere.

In addition, aspects of the present invention include discretionary combinations of the above-described elements and mutual substitution of elements or expressions of the present invention among apparatuses, methods, systems, or the like.

The present invention makes it possible to minimize degradation in refrigeration performance in a magnetic-shield fitted cryocooler used in a helium atmosphere.

Hereinafter, embodiments of the present invention will be described in detail with reference to the drawings. In the descriptions and drawings, the same reference numerals are assigned to the same or equivalent constituent elements, members, and processing, and overlapping descriptions thereof are appropriately omitted. Scales and shapes of the respective portions shown in the drawings are set for the sake of convenience in order to facilitate explanation, and are not to be interpreted limitedly unless otherwise mentioned. The embodiments are examples and do not limit the scope of the present invention. All features and combinations thereof described in the embodiments are not necessarily essential to the invention.

Figure 2:
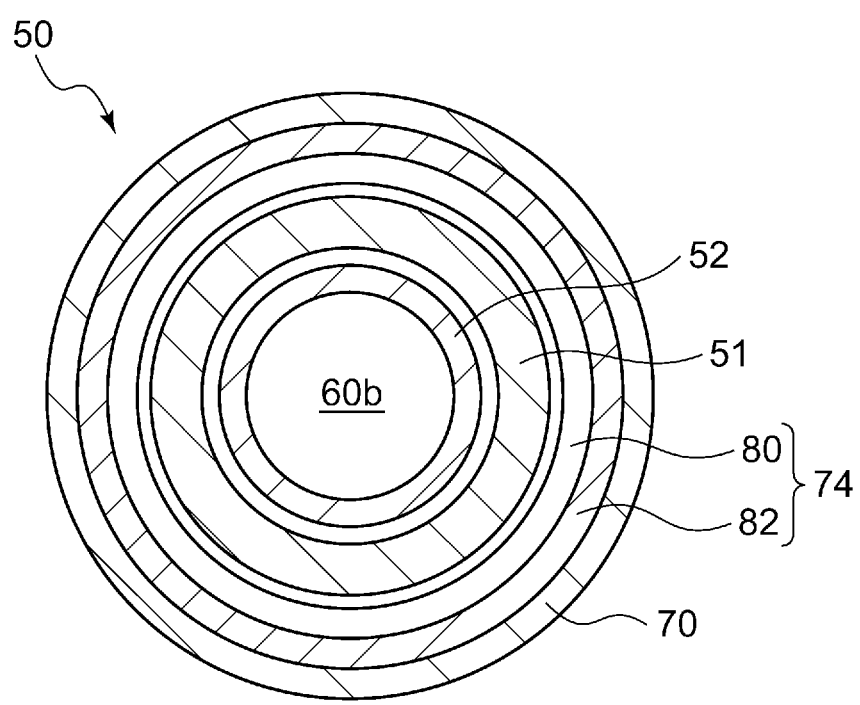
FIG. 2 is a schematic view showing a cross section taken along line A-A of the cryocooler shown in FIG. 1.

FIG. 1 is a view schematically showing a cryocooler 1 according to a first embodiment. FIG. 1 schematically shows an internal structure of the cryocooler 1. FIG. 2 is a schematic view showing a cross section taken along line A-A of the cryocooler 1 shown in FIG. 1.

The cryocooler 1 includes a regenerator section, an expander, and a compressor. In most cases, the regenerator section is provided in the expander. The regenerator section is configured to pre-cool a working gas (for example, helium gas). The expander includes a space which expands the pre-cooled working gas so as to further cool the working gas pre-cooled by the regenerator section. The regenerator section is configured to be cooled by the working gas cooled by expansion. The compressor is configured to recover the working gas from the regenerator section, compress the working gas, and supply the working gas to the regenerator section again.

In a two-stage cryocooler 1, the regenerator section includes a first-stage regenerator and a second-stage regenerator. The first-stage regenerator is configured to pre-cool the working gas supplied from the compressor to a low-end temperature of the first-stage regenerator. The second-stage regenerator is configured to pre-cool the working gas pre-cooled by the first-stage regenerator to a low-end temperature of the second-stage regenerator.

The shown cryocooler 1 is a two-stage GM cryocooler. The cryocooler 1 includes a gas compressor 3 which functions as the compressor and a two-stage cold head 10 which functions as the expander. The cold head 10 includes a first-stage cooling section 15 and a second-stage cooling section 50, and the cooling sections are coaxially connected to a room temperature flange 12. The first-stage cooling section 15 includes a first-stage high-temperature end 23a and a first-stage low-temperature end 23b, and the second-stage cooling section 50 includes a second-stage high-temperature end 53a and a second-stage low-temperature end 53b. The first-stage cooling section 15 and the second-stage cooling section 50 are connected to each other in series. Accordingly, the first-stage low-temperature end 23b corresponds to the second-stage high-temperature end 53a.

The first-stage cooling section 15 includes a first-stage cylinder 20, a first-stage displacer 22, a first-stage regenerator 30, a first-stage expansion chamber 31, and a first-stage cooling stage 35. The first-stage cylinder 20 is a hollow hermetic container that extends axially along the direction Q. The first-stage displacer 22 is provided in the first-stage cylinder 20 so as to be able to reciprocate along the axial direction Q. The first-stage regenerator 30 includes a first-stage regenerator material with which the inside of the first-stage displacer 22 is filled. In general, the first-stage regenerator material has a laminated structure configured of a plurality of wire meshes. Accordingly, the first-stage displacer 22 is a container which accommodates the first-stage regenerator material. The first-stage expansion chamber 31 is formed in the first-stage cylinder 20 on the first-stage low-temperature end 23b. The volume of the first-stage expansion chamber 31 is changed by reciprocation of the first-stage displacer 22. The first-stage cooling stage 35 is attached to an outer side of the first-stage cylinder 20 on the first-stage low-temperature end 23b. In the first-stage cooling stage 35, a first-stage flange 36 is provided along an outer peripheral surface of the first-stage cooling stage 35.

A plurality of first-stage high-temperature side flow passages 40 are provided on the first-stage high-temperature end 23a, specifically, a high-temperature side of the first-stage regenerator 30, in order to cause the helium gas to flow into or out from the first-stage regenerator 30. A plurality of first-stage low-temperature side flow passages 42 are provided on the first-stage low-temperature end 23b, specifically, a low-temperature side of the first-stage regenerator 30, in order to cause the helium gas to flow into or out from the area between the first-stage regenerator 30 and the first-stage expansion chamber 31. A first-stage seal 39 is provided between the first-stage cylinder 20 and the first-stage displacer 22 so as to seal gas flow in a gap between an inner surface of the first-stage cylinder 20 and an outer surface of the first-stage displacer 22. Accordingly, the flow of the working gas between the first-stage high-temperature end 23a and the first-stage low-temperature end 23b passes through the first-stage regenerator 30.

The second-stage cooling section 50 includes a second-stage cylinder 51, a second-stage displacer 52, a second-stage regenerator 60, a second-stage expansion chamber 55, and a second-stage cooling stage 72. The second-stage cylinder 51 forms a hollow hermetic container together with the second-stage cooling stage 72. The second-stage cylinder 51 extends along the axial direction Q so as to connect the second-stage cooling stage 72 to the first-stage cooling stage 35. A high-temperature side end of the second-stage cylinder 51 is connected to a low-temperature side end of the first-stage cylinder 20, and the second-stage cylinder 51 forms a single cylinder member together with the first-stage cylinder 20. The second-stage cylinder 51 is of smaller diameter than that of the first-stage cylinder 20. The second-stage displacer 52 is provided in the second-stage cylinder 51 so as to be able to reciprocate along the axial direction Q. The second-stage regenerator 60 includes a second-stage regenerator material with which the inside of the second-stage displacer 52 is filled. Accordingly, the second-stage displacer 52 is a container which accommodates the second-stage regenerator material.

The second-stage cooling stage 72 is shaped in the form of a short tube having approximately the same diameter as the inner diameter of the second-stage cylinder 51. The outer diameter of the second-stage cooling stage 72 is larger than the outer diameter of the second-stage cylinder 51. The second-stage cooling stage 72 includes a stage bottom portion having a helium condensation surface 62 which is disposed in a helium atmosphere, and a stage side portion which connects the stage bottom portion to the second-stage cylinder 51. The helium condensation surface 62 is provided on a side of the second-stage cooling stage 72 opposite from the side facing the second-stage expansion chamber 55 along the axial direction Q. However, the helium condensation surface 62 may be provided on the other side (that is, the stage-side portion). In order to increase the surface area of the helium condensation surface 62 so as to increase the heat exchange efficiency, the helium condensation surface 62 may be in the form of a protruding-fin structure, as indicated in FIG. 1.

The second-stage cooling stage 72 is for example directly joined to a low-temperature side end of the second-stage cylinder 51 by brazing or welding. The second-stage cylinder 51 is closed by the second-stage cooling stage 72. The second-stage expansion chamber 55 is formed between the second-stage displacer 52 and the second-stage cooling stage 72 on the second-stage low-temperature end 53b, and the volume of the second-stage expansion chamber 55 is changed by reciprocation of the second-stage displacer 52.

In addition, the second-stage cooling stage 72 is attached to the outside of the second-stage cylinder 51 so as to surround the second-stage cylinder 51 on the second-stage low-temperature end 53b. The second-stage expansion chamber 55 may be formed between the second-stage displacer 52 and the second-stage cylinder 51 on the second-stage low-temperature end 53b.

The second-stage regenerator 60 is divided into a non-magnetic regenerator material 60a and a magnetic regenerator material 60b. The non-magnetic regenerator material 60a corresponds to a high-temperature side region of the second-stage regenerator 60, and for example, is configured with the second-stage regenerator material of a non-magnetic substance such as lead or bismuth. The magnetic regenerator material 60b corresponds to a low-temperature side region of the second-stage regenerator 60, and for example, is configured with the second-stage regenerator material of a magnetic substance such as $HoCu_2$. For the magnetic regenerator material 60b, a magnetic substance whose specific heat increases according to its magnetic phase transition at an extremely low temperature is used as the regenerator material. Lead, bismuth, $HoCu_2$, or the like is formed into a spherical shape, and a plurality of spherical products are gathered to configure the second-stage regenerator material.

A second-stage high-temperature side flow passage 44 is provided on the second-stage high-temperature end 53a, specifically, a high-temperature side of the second-stage regenerator 60, in order to cause the helium gas to flow into or out from the second-stage regenerator 60. In the shown cryocooler 1, the second-stage high-temperature side flow passage 44 connects the first-stage expansion chamber 31 to the second-stage regenerator 60. A plurality of second-stage low-temperature side flow passages 54 are provided on the second-stage low-temperature end 53b, specifically, a low-temperature side of the second-stage regenerator 60, in order to cause the helium gas to flow into or out from the second-stage expansion chamber 55. A second-stage seal 59 is provided between the second-stage cylinder 51 and the second-stage displacer 52 so as to seal gas flow in a gap between an inner surface of the second-stage cylinder 51 and an outer surface of the second-stage displacer 52. Accordingly, the flow of the working gas between the second-stage high-temperature end 53a and the second-stage low-temperature end 53b passes through the second-stage regenerator 60. In addition, the second-stage cooling section 50 may be configured so that some gas flow is permitted in the gap between the second-stage cylinder 51 and the second-stage displacer 52.

The cryocooler 1 includes a pipe 7 which is connected to the gas compressor 3 and the cold head 10. A high-pressure valve 5 and a low-pressure valve 6 are provided in the pipe 7.

The cryocooler 1 is configured such that a high-pressure helium gas is supplied from the gas compressor 3 to the first-stage cooling section 15 via the high-pressure valve 5 and the pipe 7. In addition, the cryocooler 1 is configured such that a low-pressure helium gas is discharged from the first-stage cooling section 15 to the gas compressor 3 via the pipe 7 and the low-pressure valve 6.

The cryocooler 1 includes a drive motor 8 for reciprocating the first-stage displacer 22 and the second-stage displacer 52. The first-stage displacer 22 and the second-stage displacer 52 are unitarily reciprocated in the axial direction Q by the drive motor 8. In addition, the drive motor 8 is connected to the high-pressure valve 5 and the low-pressure valve 6 to selectively switch opening of the high-pressure valve 5 and opening of the low-pressure valve 6 in conjunction with the reciprocation. In this way, the cryocooler 1 is configured to appropriately switch between working-gas intake and exhaust strokes.

The cryocooler 1 includes a magnetic shielding component 76 having a tubular magnetic shield (hereinafter, simply referred to as a magnetic shield) 70 and a convection suppression member 74. The magnetic shield 70 is installed on the second-stage cooling stage 72. The convection suppression member 74 is attached to the magnetic shield 70.

The magnetic shield 70 extends on the outside of the second-stage cylinder 51 along the second-stage cylinder 51. The magnetic shield 70 is disposed outside an outer peripheral surface of the second-stage cylinder 51 and surrounds the periphery of the second-stage cylinder 51. One end of the magnetic shield 70 is fixed to the second-stage cooling stage 72 and the other end of the magnetic shield 70 extends toward the second-stage high-temperature end 53a (or the first-stage cooling stage 35). The magnetic shield 70 is a cylindrical member having a larger diameter than that of the second-stage cylinder 51 and is disposed coaxially with the second-stage cylinder 51. An inner diameter of the magnetic shield 70 is larger than an outer diameter of the second-stage cylinder 51. An outer diameter of the magnetic shield 70 may be equal to or larger than the outer diameter of the second-stage cooling stage 72.

The magnetic shield 70 is thermally coupled to the second-stage cooling stage 72 and is cooled to the temperature (for example, a temperature of approximately 4.2K or less) of the second-stage cooling stage 72. The magnetic shield 70 is not in physical contact with the first-stage cooling section 15. The axial upper end of the magnetic shield 70 is axially separated from the first-stage cooling stage 35. The magnetic shield 70 is not in physical contact with the second-stage cylinder 51. An inner surface of the magnetic shield 70 is radially separated from an outer surface of the second-stage cylinder 51.

The cryocooler 1 can be used to recondense liquid helium. A portion of the first-stage cooling section 15 and a portion of the second-stage cooling section 50 are disposed in the helium atmosphere. The cryocooler 1 is installed in a liquid helium tank 38 via the first-stage flange 36. The first-stage flange 36 is attached so as to seal an opening portion of the liquid helium tank 38. In this way, a portion of the cryocooler 1 having a temperature lower than that of the first-stage flange 36 is exposed to the inside of the liquid helium tank 38 and is disposed in the helium atmosphere. Accordingly, the second-stage cylinder 51, the second-stage cooling stage 72, and the magnetic shielding component 76 are disposed in the helium atmosphere. In other words, when the cryocooler 1 is used, surfaces of the second-stage cylinder 51, the second-stage cooling stage 72, and the magnetic shielding component 76 come into contact with the helium gas.

The magnetic shield 70 extends along the axial direction Q along the second-stage cylinder 51 from the second-stage cooling stage 72 on the outside of the second-stage cylinder 51, and is disposed such as to be separated from the first-stage cooling stage 35 by an axial separation distance L1. The axial separation distance L1 corresponds to the axial distance from the axial lower end of the first-stage cooling stage 35 to the axial upper end of the magnetic shield 70.

An annular space 78 which is open to the helium atmosphere is formed between the second-stage cylinder 51 and the magnetic shield 70. The axial upper end of the annular space 78 is open and the axial lower end of the annular space 78 is closed. The bottom surface 78a of the annular space 78 is defined by the upper surface of the second-stage cooling stage 72. In addition, in its radial orientation the annular space 78 is defined by the outer peripheral surface of the second-stage cylinder 51 and an inner peripheral surface of the magnetic shield 70. The annular space 78 is continuous circumferentially around the axial direction Q.

The axial depth L2 of the annular space 78 is longer than the axial separation distance L1. The axial depth L2 of the annular space 78 corresponds to the axial distance from the axial upper end of the magnetic shield 70 to the axial upper end of the second-stage cooling stage 72. The axial depth L2 of the annular space 78 may be longer, and for example, may be longer than 2, 5, or 10 times the axial separation distance L1. However, the axial depth L2 of the annular space 78 is shorter than the axial length of the magnetic shield 70 (or magnetic shielding component 76).

Here, the axial separation distance L1 and the axial depth L2 of the annular space 78 are each circumferentially constant over their entire circumferences. However, the present invention is not limited to this. In an implementation varying the axial separation distance L1 and the axial depth L2 of the annular space 78 circumferentially (or radially), the axial separation distance L1 is the minimum axial distance from the lower end of the first-stage cooling stage 35 to the axial upper end of the magnetic shield 70. The axial depth L2 of the annular space 78 is the maximum axial distance from the axial upper end of the magnetic shield 70 to the axial upper end of the second-stage cooling stage 72.

Increasing the axial depth L2 of the annular space 78 corresponds to extending the axial length of the magnetic shield 70. The magnetic shield 70 extends relatively long from the second-stage cooling stage 72 so as to form a relatively deep annular space 78 along the axial direction Q. In this manner, the magnetic shield 70 is relatively long, and thus, it is easy to prevent magnetic noise generated by the axial reciprocation of the magnetic regenerator material 60b from being transmitted outside the magnetic shield 70.

In order to avert thermal contact between the magnetic shield 70 and the second-stage cylinder 51, the distance between the inner surface of the magnetic shield 70 and the outer surface of the second-stage cylinder 51, that is, the radial width of the annular space 78, is 0.1 mm or more (e.g., 2 mm or more or 4 mm or more), for example. In order to avoid excessively enlarging the magnetic shield 70 radially, for example, the radial width of the annular space 78 may be 10 mm or less (e.g., 8 mm or less, or 6 mm or less).

The convection suppression member 74 is provided so as to suppress axial convection of the helium gas in the annular space 78 caused by temperature difference between the second-stage cylinder 51 and the magnetic shield 70. The convection suppression member 74 is disposed in the annular space 78. The convection suppression member 74 is of axial length longer than the axial separation distance L1. For example, the axial length of the convection suppression member 74 may be longer than 2, 5, or 10 times the axial separation distance L1. The axial length of the convection suppression member 74 is equal to the axial depth L2 of the annular space 78. Alternatively, the axial length of the convection suppression member 74 may be longer than the axial separation distance L1 and may be shorter than the axial depth L2 of the annular space 78. The convection suppression member 74 is for example formed of a metallic material such as stainless steel, ceramic, or other materials having a relatively low thermal conductivity.

The convection suppression member 74 includes a plurality of convection suppression plates 80 and a support portion 82 which supports the convection suppression plates 80. The convection suppression plates 80 are disposed in an annular space 78 to divide the annular space 78 into a plurality of annular sections 79 in the axial direction. Each of the convection suppression plates 80 is a ring-shaped portion or an annular portion extending circumferentially in the annular space 78.

The convection suppression plates 80 extend radially inward from the support portion 82. The convection suppression plates 80 radially are at a slight gap from the second-stage cylinder 51, and thus are not in contact with the second-stage cylinder 51. The radial gap is for example 0.1 mm or more and 1 mm or less. In FIGS. 1 to 3, three convection suppression plates 80 are provided. However, the number of the convection suppression plates 80 is not limited and may be any number. A single convection suppression plate 80 alone may be provided.

The annular space 78 is divided into the plurality of annular sections 79 by at least one convection suppression plate 80. Accordingly, the temperature difference generated in one annular section 79 is smaller than the maximum temperature difference generated in the annular space 78. Therefore, convection of the helium gas in each annular section 79 is controlled to a minimum, and as a result, heat transfer and refrigeration loss caused by convection decrease. Accordingly, degradation in refrigeration performance of the cryocooler 1 can be minimized.

The convection suppression plate 80 and the support portion 82 may be formed integrally with each other. Alternatively, the convection suppression plate 80 and the support portion 82 may be formed separately from each other, and the convection suppression plate 80 may be attached to the support portion 82.

In addition, if necessary, the convection suppression member 74 may include at least one convection suppression wall which is disposed in the annular space 78 to divide the annular space 78 circumferentially. The convection suppression wall extends along the support portion 82 along the axial direction Q.

The support portion 82 extends along the magnetic shield 70 along the axial direction Q, and defines the axial length of the convection suppression member 74. That is, the axial length of the support portion 82 corresponds to the axial length of the convection suppression member 74. In addition, the support portion 82 defines the axial position of each convection suppression plate 80. The support portion 82 is formed in a tubular shape, and the outer peripheral surface of the support portion 82 may come into contact with the inner peripheral surface of the magnetic shield 70. The inner peripheral surface of the support portion 82 is disposed at a gap between it and the outer peripheral surface of the second-stage cylinder 51. The convection suppression plates 80 are disposed in this gap. The shape of the support portion 82 is not limited to being tubular and can be formed in other shapes. For example, the support portion 82 may be a plurality of support rods which extend along the axial direction Q, and the support rods may be attached to the outer periphery of the convection suppression plates 80 at equal angular intervals.

In this way, the plurality of convection suppression plates 80 are arranged over a relatively extensive axial length in the annular space 78. Preferably, the plurality of convection suppression plates 80 can be arranged over the entire length axially in the annular space 78.

The support portion 82 is attached to the magnetic shield 70. The axial upper end of the support portion 82 is or example attached to the axial upper end of the magnetic shield 70 by a fastening member such as a bolt. For the attachment, the support portion 82 may include a flange portion on the axial upper end of the support portion 82. The support portion 82 may for example be joined to the magnetic shield 70 by brazing or welding. The support portion 82 may be bonded to the magnetic shield 70 by an adhesive. The support portion 82 is attached to the magnetic shield 70, and thus, compared to a case where the plurality of convection suppression plates 80 are individually attached to the magnetic shield 70, the attachment is easily performed.

The magnetic shield 70 is directly joined to the second-stage cooling stage 72. Accordingly, the second-stage cooling stage 72 is a portion of the magnetic shielding component 76. In a process of manufacturing the cryocooler 1, the magnetic shield 70 can be joined to the second-stage cooling stage 72, and thus, the manufacturing is easily performed. The direct joining between the magnetic shield 70 and the second-stage cooling stage 72 may be carried out for example by brazing. The magnetic shield 70 is formed of a metallic material having a relatively high melting point such as pure cooper, wherein brazing can thus be performed. In the process of brazing between the second-stage cylinder 51 and the second-stage cooling stage 72, the magnetic shield 70 can be similarly joined, and thus, the manufacturing is easily performed. The direct joining between the magnetic shield 70 and the second-stage cooling stage 72 may be accomplished with an adhesive.

An operation of the cryocooler 1 configured as described above will be described. First, when the first-stage displacer 22 and the second-stage displacer 52 are each positioned at or near bottom-dead center in each of the first-stage cylinder 20 and the second-stage cylinder 51, the high-pressure valve 5 is opened. The first-stage displacer 22 and the second-stage displacer 52 each move from bottom-dead center toward top-dead center. At that time, the low-pressure valve 6 is closed.

High-pressure helium gas flows into the first-stage cooling section 15 from the gas compressor 3. The high-pressure helium gas flows from the first-stage high-temperature side flow passage 40 to the inside of the first-stage displacer 22 and is cooled to a predetermined temperature by the first-stage regenerator 30. The cooled helium gas flows from the first-stage low-temperature side flow passages 42 into the first-stage expansion chamber 31. A portion of the high-pressure helium gas which has flowed into the first-stage expansion chamber 31 flows from the second-stage high-temperature side flow passage 44 to the inside of the second-stage displacer 52. The helium gas is cooled to a predetermined lower temperature by the second-stage regenerator 60 and flows from the second-stage low-temperature side flow passage 54 into the second-stage expansion chamber 55. As a result, the state in the first-stage expansion chamber 31 and the second-stage expansion chamber 55 each become a high-pressure state.

When the first-stage displacer 22 and the second-stage displacer 52 each reach top-dead center or the vicinity thereof, respectively in the first-stage cylinder 20 and the second-stage cylinder 51, the high-pressure valve 5 is closed. Approximately simultaneously with the closing of the high-pressure valve 5, the low-pressure valve 6 is opened. The first-stage displacer 22 and the second-stage displacer 52 move from top-dead center toward bottom-dead center at this time.

The helium gas in the first-stage expansion chamber 31 and the second-stage expansion chamber 55 is decompressed and expanded. As a result, the helium gas is cooled. In addition, the first-stage cooling stage 35 and the second-stage cooling stage 72 are each cooled. The low-pressure helium gas passes through reverse passages to the above-described passages, and is returned to the gas compressor 3 via the low-pressure valve 6 and the pipe 7 while cooling both the first-stage regenerator 30 and the second-stage regenerator 60.

When the first-stage displacer 22 and the second-stage displacer 52 each reach bottom-dead center or the vicinity thereof, respectively in the first-stage cylinder 20 and the second-stage cylinder 51, the low-pressure valve 6 is closed. Approximately simultaneously with the closing of the low-pressure valve 6, the high-pressure valve 5 is opened again.

In the cryocooler 1, the above-described operations are established as one cycle, and this cycle is repeated. In this manner, the cryocooler 1 absorbs heat from a cooling target (not shown) which is thermally connected respectively to the first-stage cooling stage 35 and the second-stage cooling stage 72, and can cool the cooling target.

The temperature of the first-stage high-temperature end 23a may be, for example, room temperature. The temperature of the first-stage low-temperature end 23b and the second-stage high-temperature end 53a (that is, the first-stage cooling stage 35) may for example each be within a range of approximately 20K to 40K. The temperature of the second-stage low-temperature end 53b (that is, the second-stage cooling stage 72) may for example be approximately 4K.

In this manner, the first-stage temperature is higher than the helium liquefaction temperature (approximately, 4.2K) and the second-stage temperature is equal to or lower than the helium liquefaction temperature. The helium condensation surface 62 of the second-stage cooling stage 72 is disposed in the helium atmosphere, and the helium condensation surface 62 can liquefy the helium gas around the helium condensation surface 62. In this manner, the cryocooler 1 can recondense the helium gas vaporized in the liquid helium tank 38.

The magnetic shield 70 is formed of a normal conductor. In the present specification, a material which does not transition to superconductivity even after the material is cooled to 4K is referred to as a normal conductor. In addition, the magnetic shield 70 is formed of a non-magnetic metallic material. For example, the magnetic shield 70 is formed of a good electric conductor such as pure copper. Typically, the second-stage cooling stage 72 is formed of copper, from the viewpoint of high thermal conductivity. The magnetic shield 70 may be formed of the same material as that of the second-stage cooling stage 72. The magnetic shield 70 may be formed of pure aluminum. The second-stage cylinder 51 may for example be formed of a metallic material such as stainless steel, and the magnetic shield 70 may be formed of a material having an electrical resistivity lower than that of the second-stage cylinder 51. The magnetic shield 70 surrounds the entire periphery of the second-stage cylinder 51, and thus, current circulating around the second-stage cylinder 51 can flow through the magnetic shield 70.

The magnetic shield 70 extends over the entire movement range of the magnetic regenerator material 60b moved by the reciprocation of the second-stage displacer 52. The magnetic shield 70 has a length which exceeds the movement stroke of the magnetic regenerator material 60b along the axial direction Q, and is disposed so as to include the movement stroke of the magnetic regenerator material 60b. The axial lower end of the magnetic shield 70 is positioned below the lowermost end of the magnetic regenerator material 60b when the second-stage displacer 52 is positioned at bottom-dead center according to the operation of the cryocooler. The axial upper end of the magnetic shield 70 is positioned above the uppermost end of the magnetic regenerator material 60b when the second-stage displacer 52 is positioned at top-dead center according to the operation of the cryocooler. Accordingly, it is possible to sufficiently shield leakage of a magnetic noise generated from the magnetic regenerator material 60b in the magnetic field to the surroundings.

If the magnetic regenerator material 60b is reciprocated along the axial direction Q in the magnetic field, magnetic flux interlinked with the magnetic shield 70 is changed. In order to cancel change of the magnetic flux, a current is flowed to the magnetic shield 70. Flow directions of the current differ from each other depending on the disposition of the cryocooler 1 and the applied magnetic field. However, for example, current is flowed along the axial direction Q, flowed to circulate around the axial direction Q, or flowed in other directions. Due to this current, change of the magnetic field in an area outside the magnetic shield 70 is canceled out. Accordingly, disturbance of the magnetic field in a space outside the magnetic shield 70 can decrease.

In this way, the magnetic shield 70 can prevent magnetic field fluctuations (for example, as described above, magnetic noise or magnetic field fluctuations caused by a periodical reciprocating motion of the magnetic regenerator material 60b) generated inside the magnetic shield 70 from being transferred from the inside of the magnetic shield 70 to the outside thereof. In addition, the magnetic shield 70 can prevent the magnetic field fluctuations generated outside the magnetic shield 70 from being transferred from the outside of the magnetic shield 70 to the inside thereof.

In a case where a magnetic material such as iron or a metallic material having minute magnetization such as stainless steel is attached to the second-stage displacer 52 performing a periodic reciprocating motion, the materials also become a factor of disturbing the magnetic field. The magnetic shield 70 also has the effect of suppressing the disturbance of this magnetic field.

The magnetic shield 70 may be formed of a good electric conductor, for example, and it is not necessary that the magnetic shield 70 be formed from a relatively expensive superconductor such as niobium titanium (NbTi). Accordingly, it is possible to reduce the cost of the device.

According to the findings of the inventor of the present invention, forming the magnetic shield 70 with pure copper and setting the wall thickness of the magnetic shield 70 to approximately 5 mm or more assures obtaining good fluctuating-magnetic-field shielding effects. In addition, in order to keep the weight of the magnetic shield 70 under control to facilitate handling, preferably, the thickness of the magnetic shield 70 formed of pure copper is approximately 10 mm or less. Moreover, in a case where the magnetic shield 70 is formed of pure aluminum, preferably, the thickness of the magnetic shield formed of pure aluminum is approximately 5.6 mm or less. In order to secure mechanical strength of a magnetic shield 70 formed of pure aluminum, for example, the thickness of the magnetic shield 70 may be approximately 0.5 mm or more or approximately 1 mm or more. The thickness of the magnetic shield 70 may have a distribution circumferentially along the magnetic shield 70. The shape of the magnetic shield 70 in cross section perpendicular to the axial orientation may be any shape, and is not limited to being circular. The magnetic shield 70 may be a tubular member being of elliptical form in section, or other sectional shapes.

As shown in FIG. 1, the inner diameter $D^1$ (that is, the inner diameter of the convection suppression plates 80) of the magnetic shielding component 76 is smaller than the outer diameter $D^1$ of the first-stage cylinder 20 or the first-stage cooling stage 35. Accordingly, when the magnetic shielding component 76 is attached to the second-stage cooling stage 72, the overall size of the cryocooler 1 can be made compact. In addition, the outer diameter $D_o$ (that is, an outer diameter of the magnetic shield 70) of the magnetic shielding component 76 may be smaller than the outer diameter $D_1$ of the first-stage cylinder 20 or the first-stage cooling stage 35. Accordingly, the size of the magnetic shield attached cryocooler 1 is further made compact.

Figure 3A:
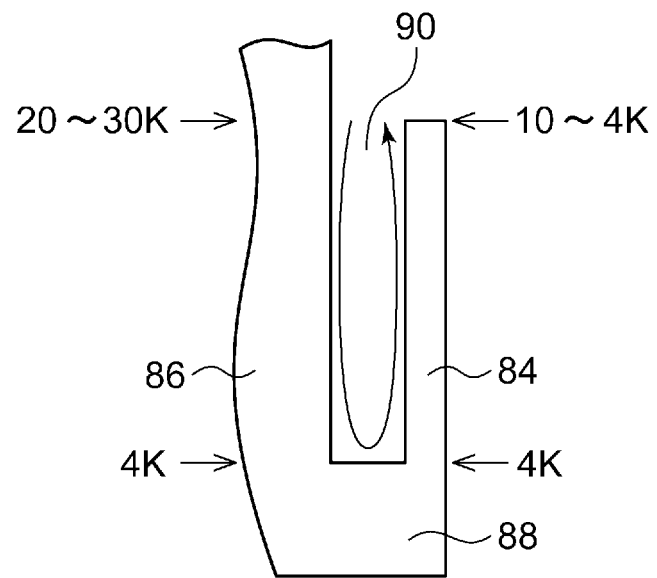
FIGS. 3A and 3B are views schematically showing a portion of a cryocooler with a typical magnetic shield attached.
Figure 3B:
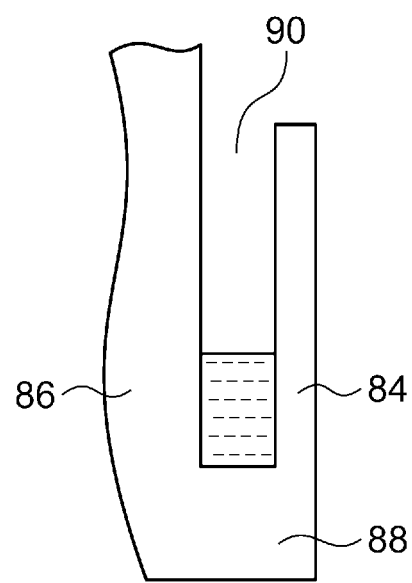

FIGS. 3A and 3B are views schematically showing a portion of a typical magnetic shield attached cryocooler. Unlike the cryocooler 1 according to the first embodiment, a structure for controlling convection of the helium gas to a minimum is not provided between a magnetic shield 84 and a cylinder member 86 of the shown cryocooler. The magnetic shield 84, the cylinder member 86, and a second-stage cooling stage 88 are disposed in the helium atmosphere.

A low-temperature end of each of the magnetic shield 84 and the cylinder member 86 is cooled to approximately 4K by the second-stage cooling stage 88. As described above, in general, the magnetic shield 84 is formed of the magnetic material having the thermal conductivity higher than that of the cylinder member 86. Accordingly, an upper end portion of the magnetic shield 84 is cooled well relatively, and for example, is cooled to be less than 10K or approximately 4K. Meanwhile, an axial position of the cylinder member 86 positioned at approximately the same as the upper end portion of the magnetic shield 84 is cooled to a higher temperature, and for example, is cooled to 20K to 30K. In this way, compared to an axial temperature distribution of the magnetic shield 84, in an axial temperature distribution of the cylinder member 86, a larger temperature difference is generated.

Accordingly, as shown in FIG. 3A, convection of the helium gas is generated over the entire axial length in a gap 90 between the magnetic shield 84 and the cylinder member 86.

This axial convection (indicated by the curved arrow) generates heat transfer between the cylinder member 86 and the magnetic shield 84, which causes a refrigeration loss of the cryocooler 1. Moreover, as shown in FIG. 3B, the cooled and liquefied helium is collected on a bottom portion of the gap 90. The liquid helium also causes refrigeration loss.

Meanwhile, in the cryocooler 1 according to the first embodiment, the convection suppression member 74 is disposed in the annular space 78 so as to suppress the axial convection of the helium gas in the annular space 78 caused by a temperature difference between the second-stage cylinder 51 and the magnetic shield 70. In this way, it is possible to suppress the axial convection of the helium gas in the annular space 78. As a result, the heat transfer and the refrigeration loss caused by the convection decrease. Therefore, it is possible to suppress a decrease in refrigeration performance of the cryocooler 1.

The axial length of the convection suppression member 74 is longer than the axial separation distance L1, and thus, it is difficult to attach the convection suppression member 74 after the convection suppression member 74 is inserted into the annular space 78 in a state where the magnetic shield 70 is installed in the cryocooler 1. Accordingly, the convection suppression member 74 is attached to the magnetic shield 70 in advance in the manufacturing process of the cryocooler 1, and the magnetic shielding component 76 is manufactured. In addition, the magnetic shielding component 76 is installed in the cryocooler 1. In this way, it is easy to provide the cryocooler 1 and the magnetic shielding component 76 as one product. For example, a manufacturer of the cryocooler 1 can provide the cryocooler 1 to a cryocooler purchaser in a state where the magnetic shielding component 76 is attached to the cryocooler 1.

Figure 4:
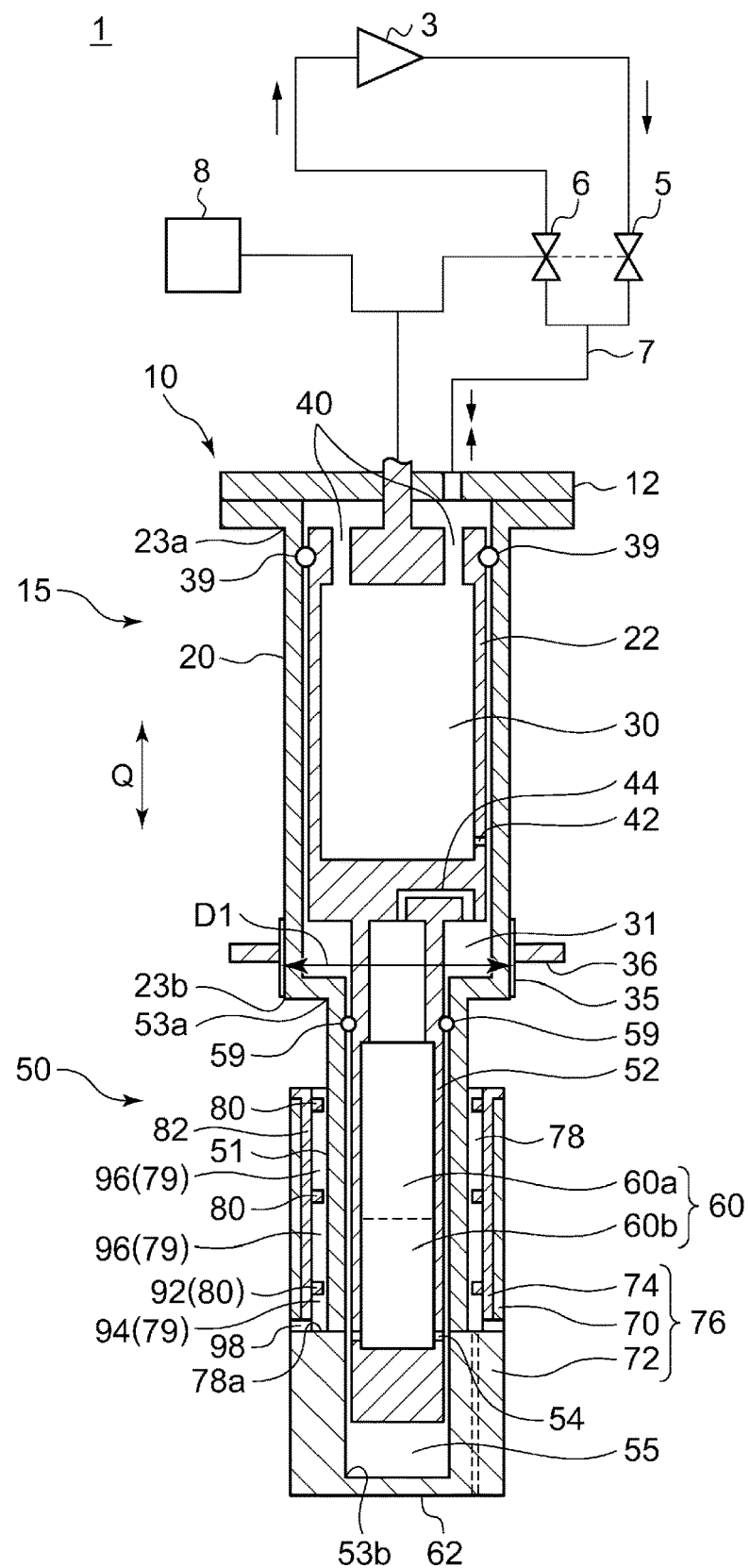
FIG. 4 is a view schematically showing a cryocooler according to a second embodiment.

FIG. 4 is a view schematically showing a cryocooler 1 according to a second embodiment. In the cryocooler 1 according to the second embodiment, the magnetic shield structure, particularly, the convection suppression member 74 is different from that of the cryocooler 1 according to the first embodiment, and configurations other than the magnetic shield structure are similar to those of the cryocooler 1 according to the first embodiment. Hereinafter, the cryocooler 1 according to the second embodiment will be described focusing on configurations different from those of the first embodiment, and the common configurations will be briefly described, or the explanation thereof will be omitted.

The convection suppression member 74 includes the plurality of convection suppression plates 80 and the support portion 82 which supports the convection suppression plates 80 and extends in the axial direction Q along the magnetic shield 70. The convection suppression plates 80 are disposed in the annular space 78 to divide the annular space 78 into the plurality of annular sections 79 in the axial direction. The support portion 82 is attached to the magnetic shield 70. The magnetic shield 70 is integrally formed with the second-stage cooling stage 72 to be provided as a component integrated with the second-stage cooling stage 72. The magnetic shield 70, the second-stage cooling stage 72, and the convection suppression member 74 configure the magnetic shielding component 76. The helium condensation surface 62 which is an end surface of the second-stage cooling stage 72 which is disposed in the helium atmosphere.

At least one convection suppression plate 80 is provided as a gas-liquid separation plate 92. Specifically, the gas-liquid separation plate 92 corresponds to the convection suppression plate 80 which is positioned at the lowermost position in the axial direction Q of the plurality of convection suppression plates 80. Similarly to other convection suppression plates 80, the gas-liquid separation plate 92 is a ring-shaped portion or an annular portion which extends in the circumferential direction in the annular space 78 and extends radially inward from the support portion 82. The gas-liquid separation plate 92 is not in contact with the second-stage cylinder 51.

The gas-liquid separation plate 92 is disposed in the annular space 78 so as to divide the annular space 78 into a liquid helium section 94 and a helium gas section 96. The liquid helium section 94 is formed between the gas-liquid separation plate 92 and the bottom surface 78a of the annular space 78 in the axial direction Q. The liquid helium section 94 corresponds to the lowermost annular section 79 in the axial direction of the plurality of annular sections 79. Each of the remaining annular sections 79 corresponds to the helium gas section 96. The helium gas section 96 is formed between two convection suppression plates 80 adjacent to each other or the convection suppression plate 80 and the gas-liquid separation plate 92 adjacent to each other.

In addition, the cryocooler 1 includes a liquid helium outflow hole 98 which is formed in the magnetic shield 70 or the second-stage cooling stage 72 such that the liquid helium flows from the annular space 78 to the outside of the magnetic shield 70. The liquid helium section 94 communicates with the helium atmosphere outside the magnetic shielding component 76 through the liquid helium outflow hole 98.

The liquid helium outflow hole 98 is formed around the bottom surface 78a of the annular space 78 and radially penetrates the magnetic shield 70. As shown in the drawings, the liquid helium outflow hole 98 is formed in a horizontal direction such that the liquid helium flows out from the liquid helium section 94 under the action of gravity when the cryocooler 1 is installed with the second-stage cooling stage 72 vertically downward. Alternatively, as shown by a dashed line, the liquid helium out flow hole 98 may be formed vertically downward through the second-stage cooling stage 72 from the bottom surface 78a of the annular space 78 or may be formed obliquely downward.

A plurality of (for example, two) liquid helium outflow holes 98 are provided at intervals in the circumferential direction. However, only one liquid helium outflow hole 98 may be provided. For example, the liquid helium outflow hole 98 is a small hole having a diameter of approximately 1 mm to 5 mm, or a diameter of approximately 2 mm to 3 mm. The liquid helium has low viscosity, and thus, the liquid helium can flow through the liquid helium outflow hole 98.

In the cryocooler 1 according to the second embodiment, the liquid helium liquefied in the annular space 78 is stored in the liquid helium section 94. The liquid helium section 94 is partitioned from the helium gas section 96 by the gas-liquid separation plate 92, and thus, re-evaporation of the liquid helium or heat exchange between the liquid helium and the convecting helium gas is suppressed. A refrigeration loss decreases, and thus, it is possible to suppress a decrease in refrigeration performance of the cryocooler 1.

The liquid helium outflow hole 98 is provided, and thus, it is possible to discharge the liquid helium from the liquid helium section 94. Accordingly, the liquid helium is easily collected in the liquid helium section 94. This also decreases the refrigeration loss.

Moreover, the annular space 78 is divided into the plurality of helium gas sections 96 by the convection suppression plates 80. Similarly to the first embodiment, the convection of the helium gas in each helium gas section is suppressed, and as a result, a heat transfer and a refrigeration loss caused by the convection decrease. Accordingly, it is possible to suppress a decrease in refrigeration performance of the cryocooler 1.

Figure 5:
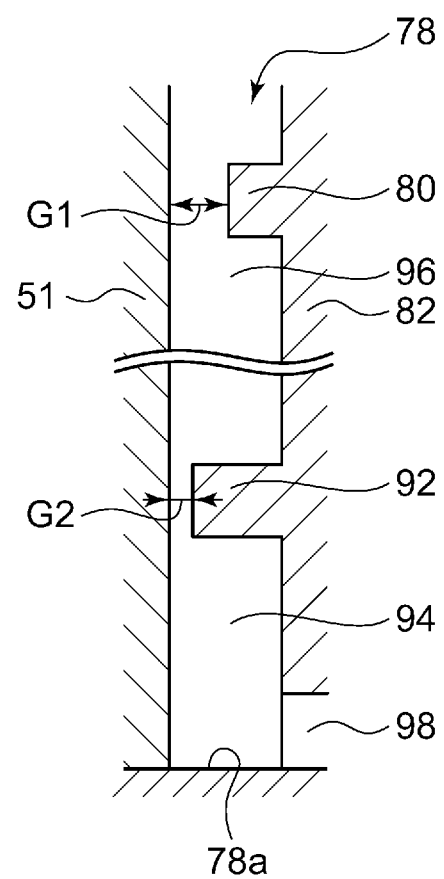
FIG. 5 is a schematic view showing a portion of the magnetic shield structure shown in FIG. 4, in an enlarged manner.

FIG. 5 is a schematic view showing a portion of a magnetic shield structure shown in FIG. 4 in an enlarged manner. As shown in FIG. 5, a first radial gap G1 is formed between the convection suppression plate 80 disposed in the helium gas section 96 and the second-stage cylinder 51. A second radial gap G2 is formed between the gas-liquid separation plate 92 and the second-stage cylinder 51. The second radial gap G2 is smaller than the first radial gap G1. As described above, for example, the first radial gap G1 is 0.1 mm or more and 1 mm or less. For example, the second radial gap G2 is 0.1 mm or more and 0.2 mm or less. Compared to other convection suppression plates 80, the gas-liquid separation plate 92 is provided to be close to the second-stage cylinder 51 from the support portion 82. In addition, the liquid helium outflow hole 98 is positioned at approximately the same axial position as that of the bottom surface 78a of the annular space 78.

In this way, the gas-liquid separation plate 92 can more effectively separate the liquid helium section 94 from the helium gas section 96. The liquid helium is contained in the liquid helium section 94 by the gas-liquid separation plate 92. It is possible to suppress the re-evaporation of the liquid helium or the heat exchange between the liquid helium and the helium gas in the helium gas section 96, and it is possible to suppress the decrease in the refrigeration performance of the cryocooler 1. In addition, even when the helium is condensed in the liquid helium section 94, the liquid helium is discharged through the liquid helium outflow hole 98.

Figure 6:
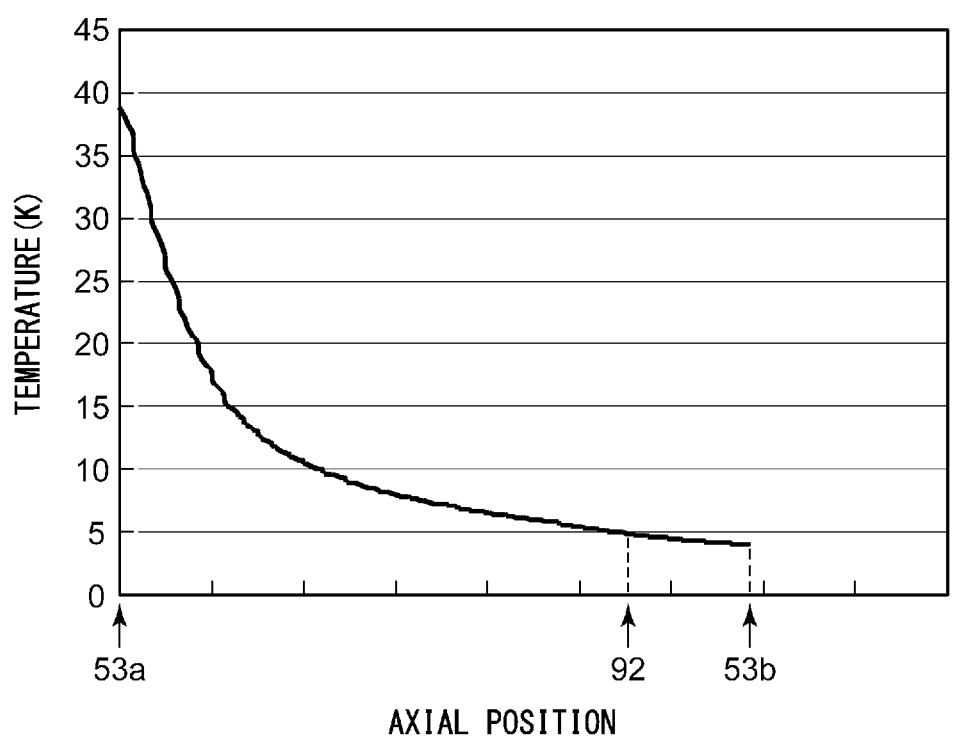
FIG. 6 is a graph exemplifying an axial temperature profile in a second-stage cooling section of the cryocooler.

FIG. 6 is a graph exemplifying a temperature profile in the axial direction Q in the second-stage cooling section 50 of the cryocooler 1. As shown in FIG. 6, the axial temperature profile in the second-stage cooling section 50 decreases monotonously from the second-stage high-temperature end 53a to the second-stage low-temperature end 53b. In the second-stage high-temperature end 53a, a temperature decreasing rate is relatively large, and in the second-stage low-temperature end 53b, a temperature decreasing rate is relatively small. For example, the axial temperature profile of the second-stage cooling section 50 can be obtained by measuring the temperatures at a plurality of different axial positions on an outer circumferential surface of the second-stage cylinder 51. Alternatively, the axial temperature profile of the second-stage cooling section 50 can be calculated by simulation.

The axial position of the gas-liquid separation plate 92 may be defined based on the axial temperature profile of the second-stage cooling section 50. A threshold temperature which is higher than the helium liquefaction temperature is considered. The gas-liquid separation plate 92 is positioned at the axial position corresponding to a temperature range from the helium liquefaction temperature to the threshold temperature. The threshold temperature may be 10K or less, 8K or less, 6K or less, or 5K or less. For example, FIG. 6 shows a case where the gas-liquid separation plate 92 is disposed at the axial position at which the temperature becomes 5K in the second-stage cooling section 50 (for example, the outer peripheral surface of the second-stage cylinder 51). In this way, the gas-liquid separation plate 92 can be disposed in accordance with a boundary between a temperature region where the helium is condensed and a temperature region where the helium is not condensed.

Figure 7:
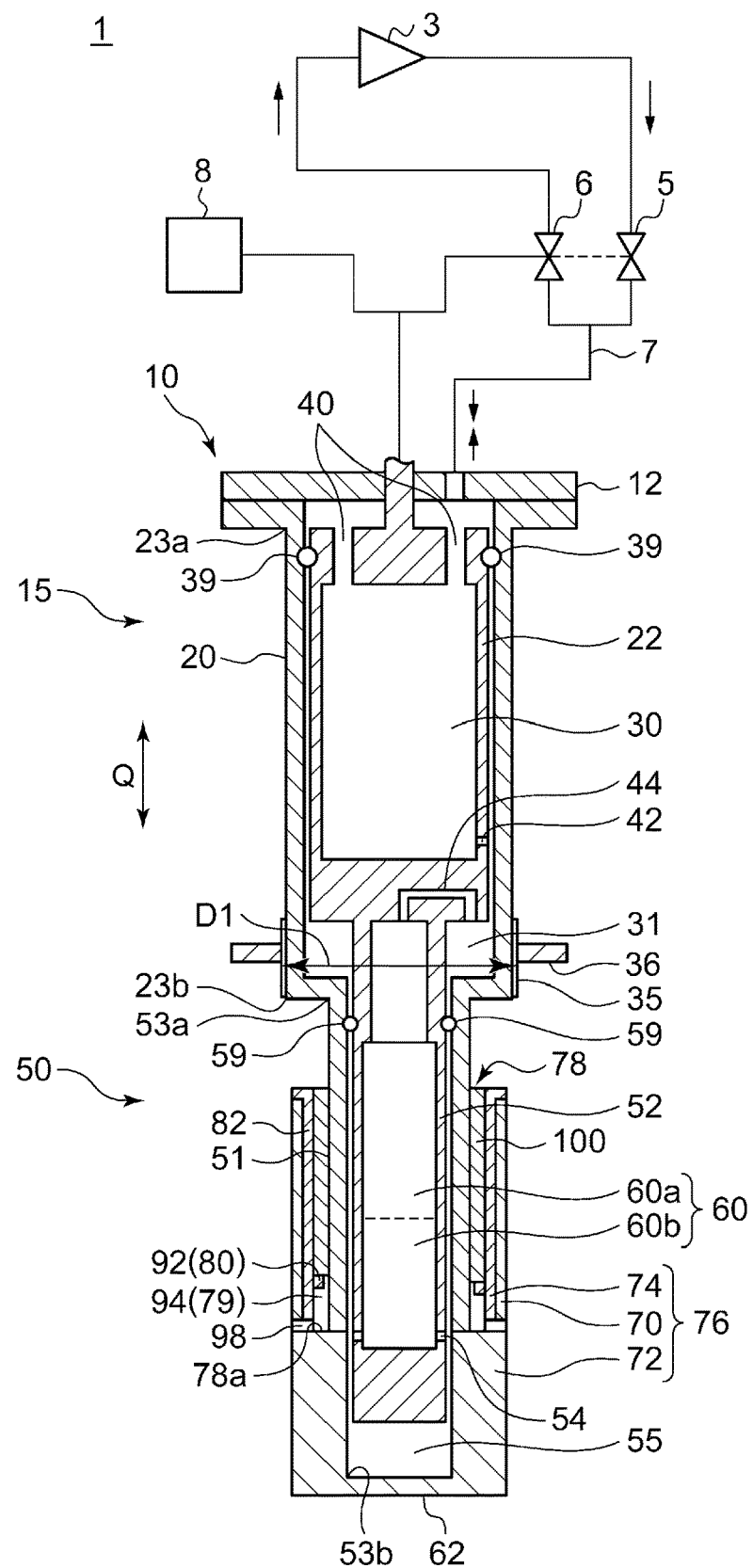
FIG. 7 is a view schematically showing a cryocooler according to a third embodiment.
Figure 8:
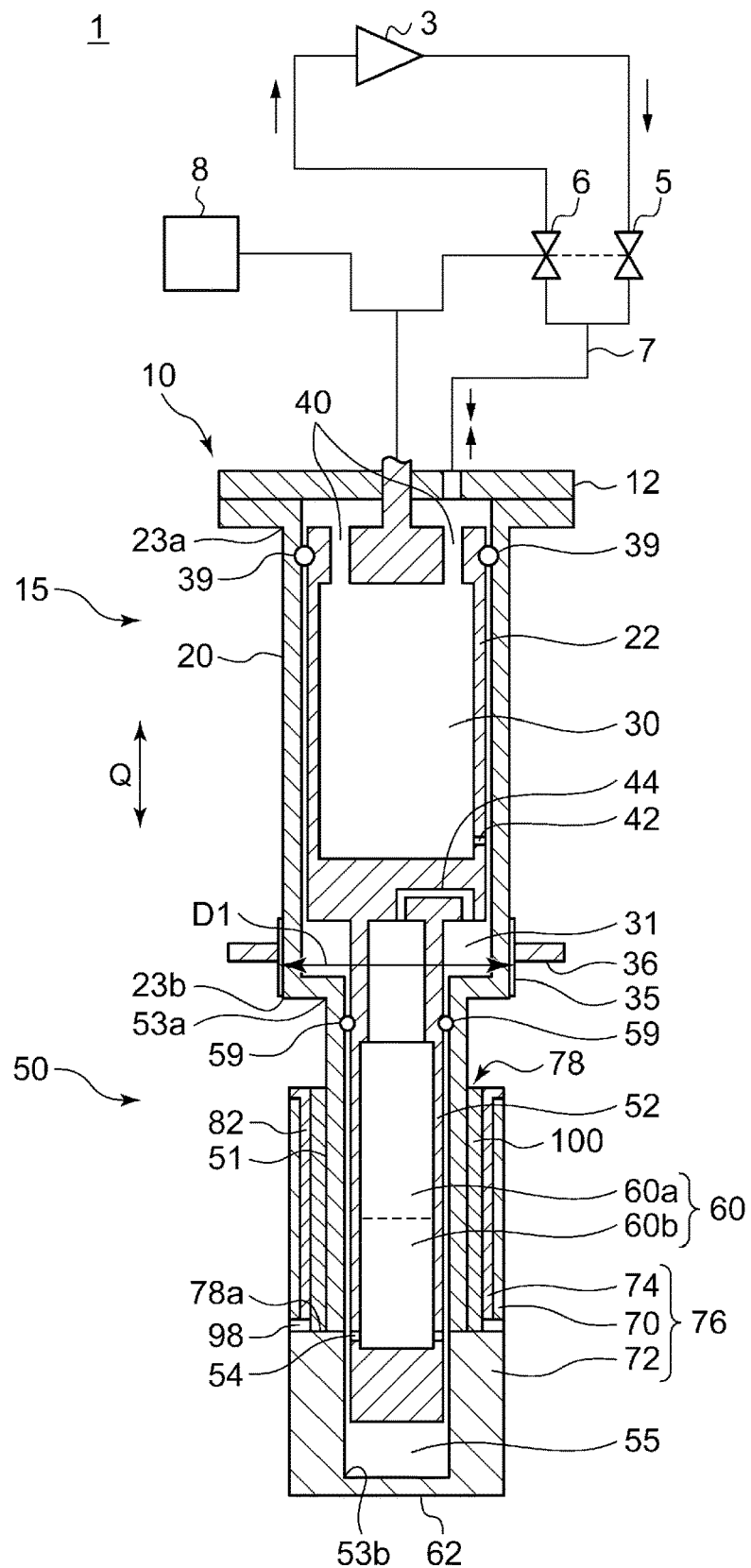
FIG. 8 is a view schematically showing the cryocooler according to the third embodiment.

FIGS. 7 and 8 schematically show a cryocooler 1 according to a third embodiment. In the cryocooler 1 according to the third embodiment, a convection suppression member 74 is different from that of the second embodiment, and other components are similar to those of the second embodiment. Hereinafter, the cryocooler 1 according to the third embodiment will be described focusing on configurations different from those of the second embodiment, and the common configurations will be briefly described, or the explanation thereof will be omitted.

As shown in FIG. 7, the convection suppression member 74 include an element 100 in the form of a felt, filling at least a portion of the annular space 78. The felt-shaped member 100 is interposed between the support portion 82 of the convection suppression member 74 and the second-stage cylinder 51 in the radial direction. The felt-shaped member 100 is supported by the gas-liquid separation plate 92 in the axial direction. The felt-shaped member 100 fills the helium gas section 96 in the second embodiment. Similarly to the second embodiment, the liquid helium section 94 is a cavity, and the felt-shaped member 100 is not provided in the liquid helium section 94.

In this way, at least a portion of the annular space 78 is filled with the felt-shaped member 100. Accordingly, the convection of the helium gas is suppressed, and as a result, the heat transfer and the refrigeration loss caused by the convection decrease. Therefore, it is possible to suppress the decrease in the refrigeration performance of the cryocooler 1.

In addition, the felt-shaped member 100 has flexibility. Accordingly, it is possible to install the felt-shaped member 100 after inserting the felt-shaped member 100 in the annular space 78 in a state where the magnetic shield 70 is installed in the cryocooler 1.

As shown in FIG. 8, the felt-shaped member 100 may fill the entirety of the annular space 78. In this case, the convection suppression plate 80 (and gas-liquid separation plate 92) is not provided in the convection suppression member 74. Even in this way, the convection of the helium gas in the annular space 78 is suppressed.

In FIG. 8, the felt-shaped member 100 is supported by the support portion 82, but this is not essential. The convection suppression member 74 does not include the support portion 82. In this case, the felt-shaped member 100 is interposed between the magnetic shield 70 and the second-stage cylinder 51 so as to be disposed in the annular space 78.

Figure 9:
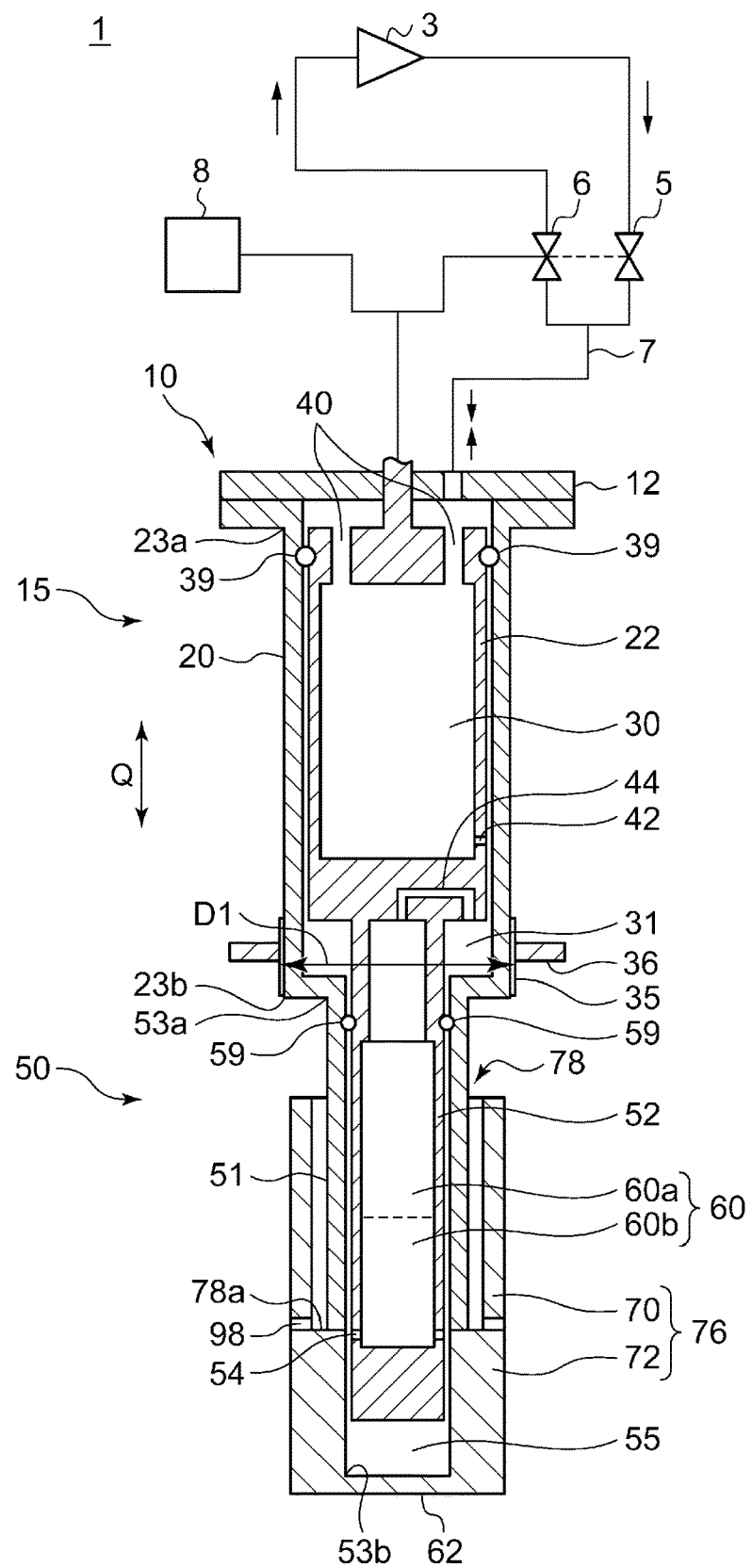
FIG. 9 is a view schematically showing a cryocooler according to a fourth embodiment.

FIG. 9 is a view schematically showing a cryocooler 1 according to a fourth embodiment. The cryocooler 1 according to the fourth embodiment does not include the convection suppression member 74. However, similarly to the second embodiment, the cryocooler 1 according to the fourth embodiment includes the liquid helium outflow hole 98.

Therefore, the liquid helium liquefied in the annular space 78 can be discharged to the external helium atmosphere through the liquid helium outflow hole 98. The liquid helium is not easily collected in the annular space 78. Accordingly, the re-evaporation of the liquid helium or heat exchange between the liquid helium and the convecting helium gas is suppressed in the annular space 78. The refrigeration loss decreases, and thus, it is possible to suppress a decrease in refrigeration performance of the cryocooler 1.

It should be understood that the invention is not limited to the above-described embodiment, but may be modified into various forms on the basis of the spirit of the invention. Additionally, the modifications are included in the scope of the invention.

In the above embodiments, the GM cryocooler is described as an example. However, the magnetic shield structure according to the embodiments can be applied to other cryocoolers such as a Sterling cryocooler and a pulse tube cryocooler.

What is claimed is:

1. A cryocooler comprising:
a first-stage cooling stage for being cooled to a first-stage temperature higher than helium's liquefaction temperature;
a second-stage cooling stage for being cooled to a second-stage temperature less than or equal to helium's liquefaction temperature, and including a helium condensation surface disposed in a helium atmosphere;
a cylinder extending in an axial direction so as to connect the second-stage cooling stage to the first-stage cooling stage;
a displacer including a magnetic regenerator material and enabled to be reciprocated in the cylinder along the axial direction;
a tubular magnetic shield axially extending along the cylinder from the second-stage cooling stage, outside the cylinder, and being disposed separated from the first-stage cooling stage by an axial separation distance, in which an annular space open to the helium atmosphere is formed between the cylinder and the tubular magnetic shield, and the annular space depth-wise axially is longer than the axial separation distance; and
at least one convection suppression plate disposed in the annular space for controlling to a minimum axial convection of helium gas in the annular space caused by temperature difference between the cylinder and the tubular magnetic shield.

2. The cryocooler according to claim 1, wherein:
the at least one convection suppression plate is disposed in the annular space to divide the annular space into a plurality of annular sections along the axial direction, and a support portion is disposed in the annular space and of a longer axial extent than the axial separation distance, the support portion supporting the at least one convection suppression plate and extending along the axial direction along the tubular magnetic shield; and
the support portion is attached to the tubular magnetic shield.

3. The cryocooler according to claim 2, wherein the at least one convection suppression plate includes a gas-liquid separation plate disposed in the annular space to divide the annular space into a liquid helium section and a helium gas section.

4. The cryocooler according to claim 3, wherein:
a first radial gap is formed between the convection suppression plate disposed in the helium gas section and the cylinder; and
a second radial gap smaller than the first radial gap is formed between the gas-liquid separation plate and the cylinder.

5. The cryocooler according to claim 1, further comprising an element of felt form, filling at least a portion of the annular space.

6. The cryocooler according to claim 1, further comprising:
a liquid helium outflow hole formed in the tubular magnetic shield or the second-stage cooling stage such that liquid helium flows from the annular space exteriorly of the tubular magnetic shield.

7. A cryocooler comprising:
a first-stage cooling stage for being cooled to a first-stage temperature higher than helium's liquefaction temperature;
a second-stage cooling stage for being cooled to a second-stage temperature less than or equal to helium's liquefaction temperature, and including a helium condensation surface disposed in a helium atmosphere;
a cylinder extending in an axial direction so as to connect the second-stage cooling stage to the first-stage cooling stage;
a displacer including a magnetic regenerator material and enabled to be reciprocated in the cylinder along the axial direction;
a tubular magnetic shield axially extending along the cylinder from the second-stage cooling stage, outside the cylinder, and being disposed separated from the first-stage cooling stage by an axial separation distance, in which an annular space open to the helium atmosphere is formed between the cylinder and the tubular magnetic shield, and the annular space depth-wise axially is longer than the axial separation distance; and
a liquid helium outflow hole formed in the tubular magnetic shield such that liquid helium flows from the annular space exteriorly of the tubular magnetic shield.

8. A magnetic shield structure of a cryocooler,
the cryocooler including a first-stage cooling stage for being cooled to a first-stage temperature higher than helium's liquefaction temperature, a second-stage cooling stage for being cooled to a second-stage temperature less than or equal to helium's liquefaction temperature, and including a helium condensation surface disposed in a helium atmosphere, and a cylinder extending in an axial direction so as to connect the second-stage cooling stage to the first-stage cooling stage, and
the magnetic shield structure comprising:
a tubular magnetic shield axially extending along the cylinder from the second-stage cooling stage, outside the cylinder, and being disposed separated from the first-stage cooling stage by an axial separation distance, in which an annular space open to the helium atmosphere is formed between the cylinder and the tubular magnetic shield, and the annular space depth-wise axially is longer than the axial separation distance; and
a liquid helium outflow hole formed in the tubular magnetic shield such that liquid helium flows from the annular space exteriorly of the tubular magnetic shield.

9. A cryocooler comprising:
a first-stage cooling stage for being cooled to a first-stage temperature higher than helium's liquefaction temperature;
a second-stage cooling stage for being cooled to a second-stage temperature less than or equal to helium's liquefaction temperature, and including a helium condensation surface disposed in a helium atmosphere;
a cylinder extending in an axial direction so as to connect the second-stage cooling stage to the first-stage cooling stage;

a displacer including a magnetic regenerator material and enabled to be reciprocated in the cylinder along the axial direction;

a tubular magnetic shield axially extending along the cylinder from the second-stage cooling stage, outside the cylinder, and being disposed separated from the first-stage cooling stage by an axial separation distance, in which an annular space open to the helium atmosphere is formed between the cylinder and the tubular magnetic shield, and the annular space depth-wise axially is longer than the axial separation distance; and a convection suppression felt element disposed in the annular space for controlling to a minimum axial convection of helium gas in the annular space caused by temperature difference between the cylinder and the tubular magnetic shield.

* * * * *